United States Patent [19]

Morishita et al.

[11] 4,281,339

[45] Jul. 28, 1981

[54] COLOR SOLID STATE IMAGE PICK-UP APPARATUS

[75] Inventors: Masanobu Morishita; Takanori Tanaka, both of Tokyo, Japan

[73] Assignee: Nippon Electric Co., Ltd., Japan

[21] Appl. No.: 44,399

[22] Filed: May 31, 1979

[30] Foreign Application Priority Data

Jun. 5, 1978 [JP] Japan .................................. 53/67959

[51] Int. Cl.³ .............................................. H04N 9/09
[52] U.S. Cl. ........................................ 358/52; 358/43
[58] Field of Search ................................... 358/52, 43

[56] References Cited
U.S. PATENT DOCUMENTS 4,166,280  8/1979  Poole ..................................... 358/52

Primary Examiner—Richard Murray
Attorney, Agent, or Firm—Charles W. Helzer

[57] ABSTRACT

A color solid state image pick-up apparatus comprises an optical system which separates incident light into a brightness light component and a plurality of color light components, a first solid state image pick-up device having photoelectric converting units disposed at a position of a light image of the brightness light component and a group of second solid state image pick-up devices with their photoelectric converting units disposed at positions respectively corresponding to positions of light images of the color light components.

Each one of the second solid state image pick-up devices includes charge transfer electrodes and a charge detection element. There are provided first drive circuit which drives the first solid state image pick-up device for sequentially detecting signal charges corresponding to respective photoelectric converting units of the first solid state image pick-up device, and a second drive circuit which drives the second solid state image pick-up devices so as to synthesize signal charges which are sequentially transferred through portions beneath at least two charge transfer electrodes of at least one second solid state image device to enter into the charge detection elements thus producing a color signal.

8 Claims, 10 Drawing Figures

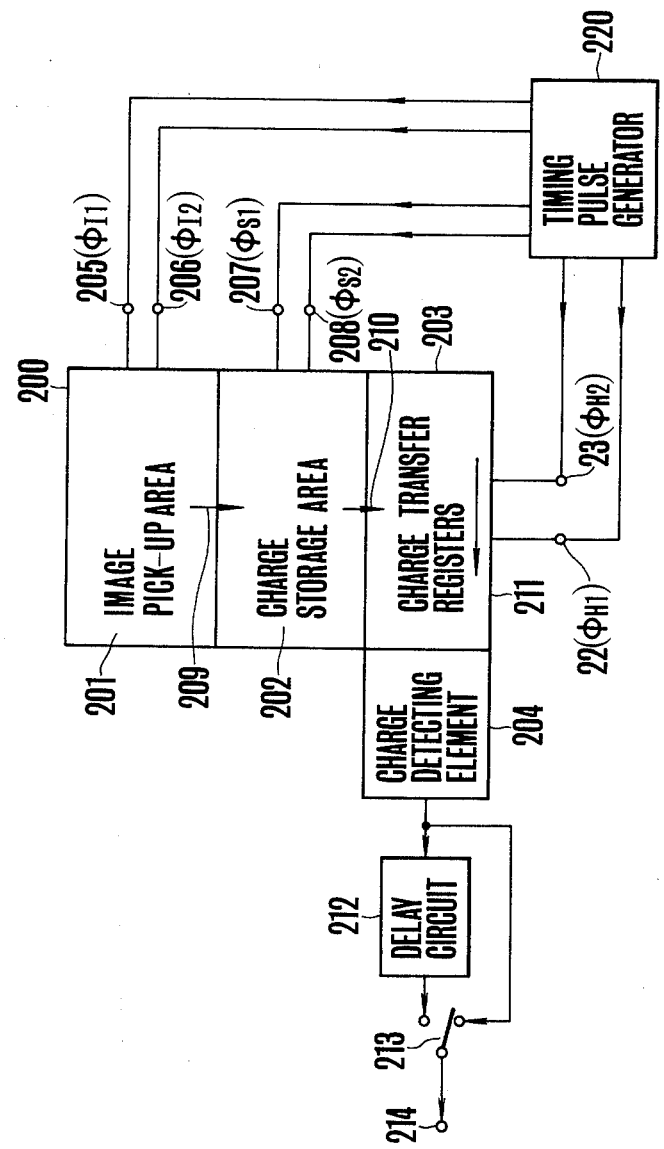
F I G. 9

COLOR SOLID STATE IMAGE PICK-UP APPARATUS

BACKGROUND OF THE INVENTION

This invention relates to a color solid state image pick-up apparatus utilizing a solid state image pick-up device comprising a charge transfer element.

Generally, a solid state image pick-up device comprising a charge transfer element utilizes polycrystalline silicon as an electrode for transfering electric charge and in most cases incident light is irradiated from the side of such charge transfer electrode so that the incident light is absorbed by the polycrystalline silicon thus degrading the sensitivity. According to one method of improving the sensitivity, a semiconductor substrate of the solid state image pick-up device is made thin so as to irradiate the incident light on the side of the substrate opposite the charge transfer side (that is the rear surface) thereby decreasing the adverse effect caused by the polycrystalline silicon. But until today, a sensitivity comparable with that of such image pick-up tubes as Visicon and Saticon (both tradenames) could not be attained.

SUMMARY OF THE INVENTION

It is an object of this invention to provide a novel color solid state image pick-up apparatus wherein the sensitivity is improved by the unique utilization of the characteristics of a charge transfer element.

Generally, the charge transfer element includes an element which detects electric charge which is accumulated and transferred thereto so as to produce an output signal.

A modern charge transfer element generally includes a sample and hold type charge detecting element. As is well known in the art, with a solid state image pick-up device utilizing a charge detecting element of the type referred to above it is possible to synthesize charge patterns of a plurality of continuous photoelectric converting elements in the charge detecting element. See for example Japanese laid open patent specification No. 55,317 of 1977. In a bidimensional charge transfer element constituted by rows and columns, when a signal charge is transferred from a charge transfer channel extending in the column or vertical direction to a charge transfer channel in the row or horizontal direction, it is possible to synthesize signal charges of a plurality of continuous photoelectric converting elements extending in the column or vertical direction, in the charge transfer channel extending in the row or horizontal direction. The principle of this phenomenon will be described later. Such synthesis in the charge transfer element of signal charges corresponding to a plurality of photoelectric converting elements wwhich are continuous in the direction of the charge transfer channel can be considered as an improvement in the sensitivity by a factor equal to the number of the synthesized photoelectric converting elements. In this case, the effective number of picture elements is equal to the original number of the elements divided by the number of the synthesized photoelectric converting elements.

Generally in a color television system whether it is NTSC system, PAL system or SECAM system, the bandwidth of the color signal component is determined to be narrower than that of the brightness signal component or luminance signal. The reason for using this characteristic is that the resolution of human eyes for color is lower than brightness. As above described, since it is possible to narrow the bandwidth of the color signal component, in a color image pick-up apparatus of the separated luminance system, image pick-up devices used for color signals are not required to have a high degree of resolution. Hence, it has been necessary to satisfy the bandwidth requirements necessary for color signals even if the resolution is impaired by the synthesis of signal charges of a plurality of continuous photoelectric converting elements by using aforementioned solid state image pick-up devices comprising charge transfer elements. In other words, if it is possible to improve the sensitivity of the image pick-up devices used for color signals irrespective of their poor resolution, it would be possible to increase the amount of light impinging upon the image pick-up device in charge of the luminance signal thereby improving the sensitivity of the color image pick-up apparatus. It is impossible to do this where a conventional image pick-up tube is used.

Also in a three plate type (RGB system) color image pick-up apparatus, the blue sensitivity of a solid state image pick-up device utilizing a silicon substrate is poor. For this reason, it is possible to obtain a color picture image of sufficient high quality by improving the sensitivity of an image pick-up device in charge of the blue color component by the synthesis inside of the solid state image pick-up device as above described and by utilizing for the light brightness (luminescence) component the high band component from the image pick-up device in charge of the green color component which is very close to the light brightness component.

Although the foregoing description relates to the resolution in the row or horizontal direction, where the number of the picture elements in the row direction is relatively small, it is not desirable to decrease the resolution in this direction below the number of the picture elements. However, it may be desirable to improve the sensitivity at the sacrifice of the resolution in the column direction, since it is possible to improve the sensitivity by synthesizing, in the charge transfer channel extending in the row or horizontal direction, signal charges of a plurality of continuous photoelectric converting elements in the column or vertical direction and by using a delay circuit having 1H (one horizontal period).

According to one embodiment of this invention, there is provided a color solid state image pick-up apparatus comprising a beam splitting prism or optical system which separates incident light from an object to be photographed into a brightness light component, and a plurality of color light components; a first solid state image pick-up device having photoelectric converting units disposed at a position of a light image of the brightness light component; a group of second solid state image pick-up devices with their photoelectric converting units disposed at positions respectively corresponding to positions of light images of the plurality of color light components; each of the second solid state image pick-up devices having charge transfer electrodes and a charge detection element; a first drive circuit which drives the first solid state image pick-up device for sequentially detecting signal charges corresponding to respective photoelectric converting units of the first solid state image pick-up device; and a second drive circuit which drives the group of the second solid state image pick-up devices so as to synthesize signal charges which are sequentially transferred through positions beneath at least two charge transfer electrodes of at least one second solid state image pick-up device to enter into the charge transfer elements for producing a color signal.

According to another embodiment of this invention there is provided a color solid state image pick-up apparatus comprising an optical system which separates incident light from an object to be photographed into a green color component, a blue color component and a red color component; a first solid state image pick-up device having a photoelectric converting unit which is disposed at a position of a light image of the green color component and including a plurality of photoelectric converting elements; a second and a third solid state image pick-up devices respectively having photoelectric converting units which are disposed at positions of light images of the blue and red color components and respectively including a plurality of charge transfer electrodes and a charge detection element, a first drive circuit for driving the first solid state image pick-up device so as to sequentially detect signal charges of respective photoelectric converting elements of the first solid state image pick-up device; a second drive circuit which synthesizes, in the charge detection elements, signal charges of a plurality of continuous photoelectric converting elements, the signal charges being sequentially transferred through portions beneath at least one of charge transfer electrodes of the second and third solid state image pick-up devices into the charge detection elements, a filter circuit for separating an output signal from the first solid state image pick-up device into a low pass component and a high pass component; a matrix circuit for synthesizing two types of color difference signals and a brightness signal of the low pass component in accordance with the low pass component of an output signal of the filter circuit and output signals of the second and third solid state image pick-up devices; and a synthesizing circuit which adds together a brightness signal of the low pass component of an output signal of the matrix circuit and a high pass component of an output of the first solid state image pick-up device thereby synthesizing a brightness signal of a high pass band.

According to still another embodiment of this invention, there is provided a color solid state image pick-up apparatus comprising an optical system which divides incident light from an object to be photographed into first and second components; a first solid state image pick-up device with a photoelectric converting unit disposed at a position of a light image of the first light component and including a plurality of photoelectric converting elements; a color filter arranged at a position of a light image of the second light component comprising a repetition of a plurality of color filter elements having different spectrum characteristics; a second solid state image pick-up device comprising a charge detection element and a plurality of charge transfer elements which are arranged such that several photoelectric converting elements of the second solid state image pick-up device corresponding to one of the color filter elements of the color filter; a first drive circuit which drives the first solid state image pick-up device so as to sequentially detect signal charges corresponding to respective photoelectric converting elements of the first solid state image pick-up device; and a second drive circuit which drives the second solid state image pick-up device so as to synthesize in the charge detection element signal charges of the photoelectric converting elements corresponding to the color filter elements of the color filter, the signal charges being sequentially transferred through portions beneath the charge transfer elements of the second solid state image pick-up device into the charge detection element.

According to a further embodiment of this invention, there is provided a color solid state image pick-up apparatus of separated luminance type wherein incident light from an object is decomposed into a brightness component and color components and wherein one or more solid state image pick-up devices are utilized each comprising a plurality of charge transfer elements arranged in rows and columns and disposed at positions corresponding to light images of the color components, the color solid state image pick-up apparatus comprises a drive circuit which drives one or more of the plurality of solid state image pick-up devices corresponding to color signals so as to synthesize at a portion beneath the charge transfer elements adapted to transfer charges in a row direction of a plurality of continuous photoelectric converting elements of one more solid state image pick-up devices which are arranged in the direction of said column of the charge transfer elements; delay circuits connected to one or more of the plurality of solid state image pick-up devices corresponding to the color signals for delaying output signals of one or more solid state image pick-up devices corresponding to the color signals by a time corresponding to one period in which signal charges of respective solid state image pick-up devices are transferred in the direction of a row of the charge transfer elements; and a synchronizing circuit including means for switching an output of the delay circuit and an output signal of a solid state image pick-up device corresponding to the delay circuit thereby producing a continuous signal.

BRIEF DESCRIPTION OF THE DRAWINGS

Further objects and advantages of the invention can be more fully understood from the following detailed description in conjunction with the accompanying drawings in which:

FIG. 9 is a connection diagram showing still another embodiment of the solid state image pick-up device of the frame transfer type.

DESCRIPTION OF THE PREFERRED EMBODIMENTS

Figure 1:
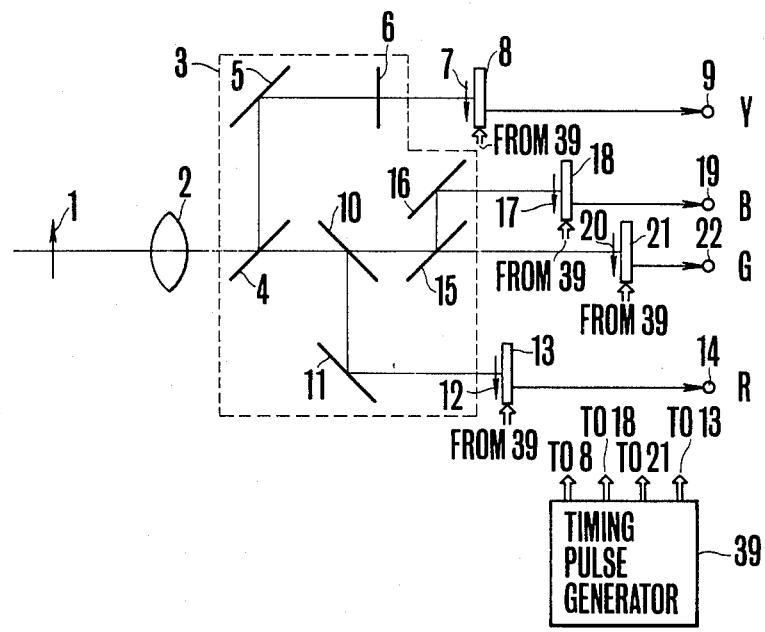
FIG. 1 is a diagrammatic representation of an optical system embodying the invention.
Figure 2:
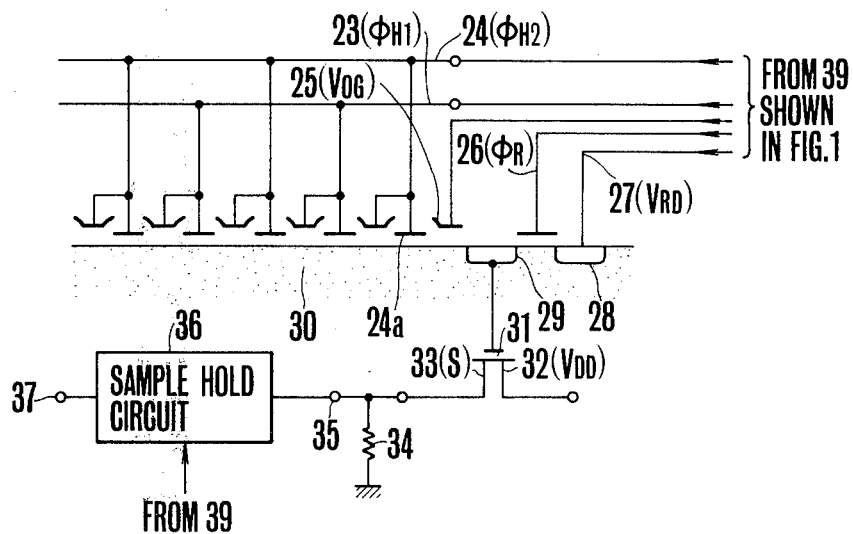
FIG. 2 is a diagram showing the construction of charge transfer registers in the column direction of a solid state image pick-up made up of a plurality of charge transfer elements.

FIGS. 1 and 2 illustrate one embodiment of the solid state image pick-up apparatus of this invention in which FIG. 1 shows an optical system of a four plate type color image pick-up device of the separated luminance type, while FIG. 2 shows the basic construction of the solid state image pick-up device utilized in the system of this invention.

More particularly, in FIG. 1, light from an object 1 to be photographed enters into an optical system 3 through a lens 2 in which the light is divided into two parts by means of a half mirror 4. The light reflected by the half mirror 4 reaches a photoelectric converting unit of a solid state image pick-up device 8 via a total reflection mirror 5 and a Y filter 6 to form a brightness component image or luminance image 7 at the photo-electric converting unit. A brightness or luminance electric signal obtained by converting the image 7 into an electric signal is produced by the solid state image pick-up device 8 at an output terminal 9. Red color light of the light component passing through the half mirror 4 is reflected by a dichromic mirror 10, while other color light rays are transmitted through the dichromic mirror 10. The reflected red color light reaches a photoelectric converting unit of a solid state image pick-up device 13 via a total reflection mirror 11 to form a red color light image 12 at the photoelectric converting unit. A red color signal obtained by converting image 12 into an electric signal is produced by the solid state image pick-up device 13 at an output terminal 14. Blue color light of the light passing through the dichromic mirror 10 is reflected by a dichromic mirror 15 while green color light passes therethrough. The reflected blue color light reaches a photoelectric converting unit of a solid state image pick-up device 18 to form a blue color light image 17 thereat, and a blue color electric signal obtained by converting image 17 into an electric signal, is produced by the solid state image pick-up device 18 at an output terminal 19. The green color light passing through the dichromic mirror 15 forms a green color light image 20 on the photoelectric converting unit of a solid state image pick-up device 21, and a green color signal obtained by converting image 20 into an electric signal, is produced by the solid state image pick-up device 21 at an output terminal 22. Respective solid state image pick-up devices 8, 13, 18 and 21 are supplied with control pulses constituted by a number of timing pulses generated by a timing pulse generator 39.

When encoding color television signals with the four plate independent luminance type color pick-up device described above, the signal appearing at the output terminal 9 is used as a brightness signal, whereas signals appearing at output terminals 14, 19 and 22 are used as red, green and blue color signals for synthesizing color chrominance signals R-Y, B-Y or I, Q. Considering a NTSC system, a frequency of 1.5 MHz is sufficient for the bandpass of the color chrominance signal. In view of the fact that in almost of all recent television receiving sets and color monitor sets, the bandwith of 0.5 MHz is generally selected for the color signals. Hence, there would be no trouble when the bandwidth of the color difference signal is selected to be 0.5 MHz. In other words, in a color signal system of the separated luminance type color image pick-up apparatus it is not necessary to use a wide bandpass.

The manner of synthesizing signal charges of a plurality of continuous photoelectric converting elements in a charge detecting element by a charge transfer element will now be described with reference to FIG. 2 which shows a charge detecting element directly related to the solid state image pick up device of this invention and circuit components associated therewith. A group of transfer electrodes such as 24a are arranged on the surface of silicon substrate 30 and are driven by so-called two phase drive system operated by two pulses $\phi_{H1}$ and $\phi_{H2}$ having a phase difference of 180°. When drive pulses $\phi_{H1}$ and $\phi_{H2}$ having a phase difference 180° as shown in FIGS. 3a and 3b are applied to electrodes 23 and 24 from the timing pulse generator 39, the charge beneath electrode 24a closest to the last transfer electrode 25 which is supplied with DC voltage $V_{OG}$ moves to a diffused layer 29 through a portion beneath the electrode 25 when the pulse applied to electrode 24 terminates. When charge is transferred to diffused layer 29 its potential varies. This potential variation is taken out by a MOS transistor 31 which constitutes a charge detection element of source follower connection type and an output signal is sent to output terminal 35 from the source electrode 33(S) of the MOS transistor 31. A resistor 34 constituting the detecting element acts as a load resistance of the source follower circuit and 32 designates the drain electrode of the MOS transistor 31 which is supplied with a DC voltage $V_{DD}$. At the next termination of the pulse signal $\phi_{H2}$ applied to electrode 24, a positive pulse signal $\phi R$ is applied to electrode 26 to transfer the charge which has been stored in the layer 29 to a deffused layer 28.

At this time, since positive voltage $V_{RD}$ is applied to electrode 27 the charge transferred to the diffused layer 28 is dissipated in electrode 27. When a pulse signal $\phi R$ is applied to electrode 26 such that both pulses $\phi RA$ and $\phi RB$ shown by solid and dotted lines (FIG. 3c) are applied, the signal appearing at the output terminal 35 will have a waveform comprising a combination of a positive portion $P_A$ and a dotted portion $P_B$ as shown in FIG. 3d. This is the device output of a system in which waveform synthesis is not performed. In this invention, when a pulse signal $\phi R$ consisting of only the solid line portion $\phi_{RA}$ and not containing the dotted line portion $\phi_{RB}$ (See FIG. 3c) is applied to electrode 26 the charge would be transferred twice to diffused layer 29 from beneath electrode 24 because two sets of drive pulses $\phi_{H1}$ and $\phi_{H2}$ have been applied to respective electrodes during one period T of the pulse signal $\phi_{H2}$. Thus, an output signal having a waveform as shown by solid lines in FIG. 3d would be obtained from output terminal 35. This output signal is sent to a sample hold circuit 36 for sampling the peak portion in accordance with a sampling pulse (FIG. 3e) sent from the timing sample pulse generator 39 thus producing an image signal at output terminal 37. According to the conventional driving method, the image signal at the output terminal 37 can reach a signal level $L_1$ shown by dotted lines in FIG. 3d whereas according to this invention twice equal level $L_2$ shown by solid lines in FIG. 3d can be obtained. This corresponds to a 100% improvement of the sensitivity. However, as this requires the addition of two picture elements (photoelectric converting elements), the resolution in the row or horizontal direction decreases to one half. The above described signal appearing at terminal 37 and having twice the previous amplitude level persists until the next sampling is performed.

When at least one of the solid state image pick-up devices 13, 18 and 21 for color components is driven as shown by dotted lines shown in FIGS. 3c and 3d, the sensitivity of the color signal can be improved.

It is said that a solid state image pick-up device utilizing a silicon substrate has a poor blue color sensitivity so that when the solid state image pick-up device 18 in charge of the blue color light is driven by the method described above, the blue color sensitivity increases to twice what it otherwise would be thus preventing decrease in the blue color sensitivity. When two or all of the solid state image pick-up devices 13, 18 and 21 are driven as shown by solid lines in FIGS. 3c and 3d, the sensitivity of these solid state image pick-up devices are doubled. Accordingly it is possible to change the ratio of the light reflected by and transmitted through the half mirrow 4 shown in FIG. 1 thus further improving the sensitivity of the image pick-up device. Assume now that the light quantity in the brightness signal channel and that in the color signal channel balance each other when the ratio between the reflected light and the transmitted light of the half mirror 4 is selected to be 4:6. When the solid state image pick-up devices 13, 18 and 21 for producing color signals are driven as shown by dotted lines in FIGS. 3c and 3d, the sensitivities of respective color signal channels can be increased twice thus changing the ratio of dividing the light by the half mirror 4.

Thus, in order to balance the quantities of the divided light under these conditions the division ratio of the reflected light and the transmitted light should be changed to about 6:4. This increases the sensitivity of the image pick-up device by a factor of 1.5.

Figure 3:
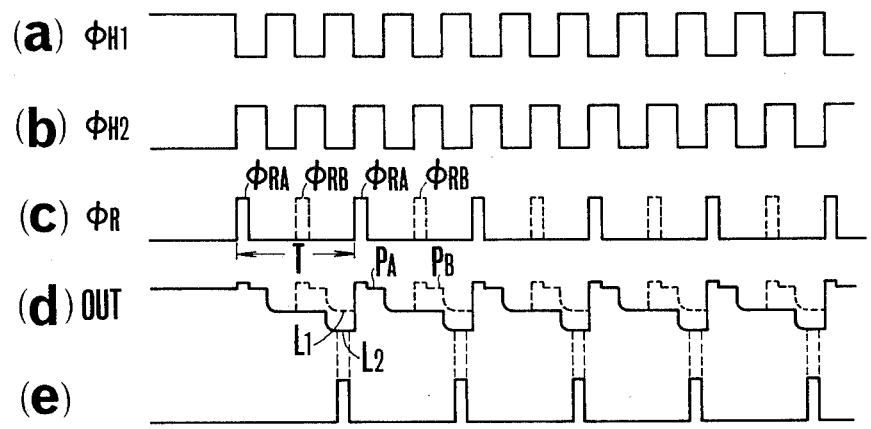
FIG. 3a through 3e show waveforms at various portions useful to explain the method of driving the charge transfer registers constituting a portion of this invention.
Figure 4:
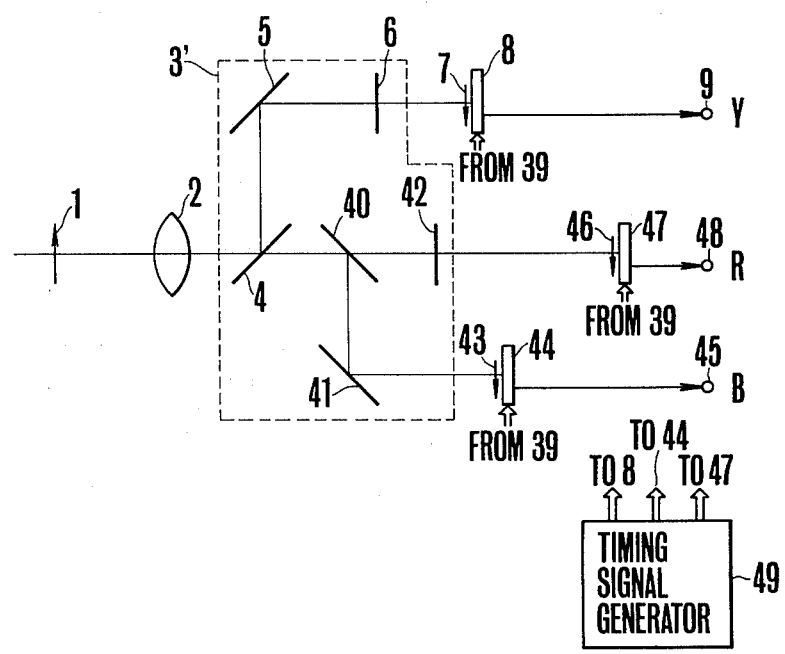
FIG. 4 is a diagrammatic representation of a modified optical system of this invention.

FIG. 4 shows a modified embodiment of this invention or a 3 plate type color image pick-up apparatus of the separated luminance type wherein three solid state image pick-up devices for red, green and blue color signals shown in FIG. 1 is reduced to two solid state image pick-up devices for red and blue color signals and the third pick-up device is used for extracting the liminence component in the same manner as shown in FIG. 1. In FIG. 4, an optical system 3' comprises a dichromic mirror 40 for reflecting blue color light, a total reflecting mirror 41 and a red light transmitting filter 42 in addition to half mirror 4, total reflecting mirror 5 and Y filter 6 which are also shown in FIG. 1. The light reflected by the total reflecting mirror 41 forms an image 43 on a photoelectric converting unit of a solid state image pick-up device 44 for a blue color signal so that the solid state image pick-up device 44 produces an electrical signal corresponding to a blue color image at an output terminal 45. The light passing through the red light transmitting filter 42 produces an image 46 on photoelectric converting unit of a solid state image pick-up device 47 for producing a red light signal whereby the solid state image pick-up device 47 produces an electrical signal corresponding to a red light image on an output terminal 48. With this modified embodiment too, by driving the solid state image pick-up devices 44 and 47 as shown by solid lines in FIGS. 3c and 3d, the sensitivity of the color signal channel can be improved thereby improving the sensitivity of the image pick-up device. A timing pulse generator 49 is provided for supplying timing pulses to respective solid state image pick-up devices.

It should be understood that the separated luminance type color image pick-up apparatus to which the invention is applicable is not limited to the forms shown in FIGS. 1 and 4. The color optical systems 3 and 3' are not limited to those illustrated in FIGS. 1 and 4, the prism type analytical optical system can also be used with the same advantages.

Figure 5:
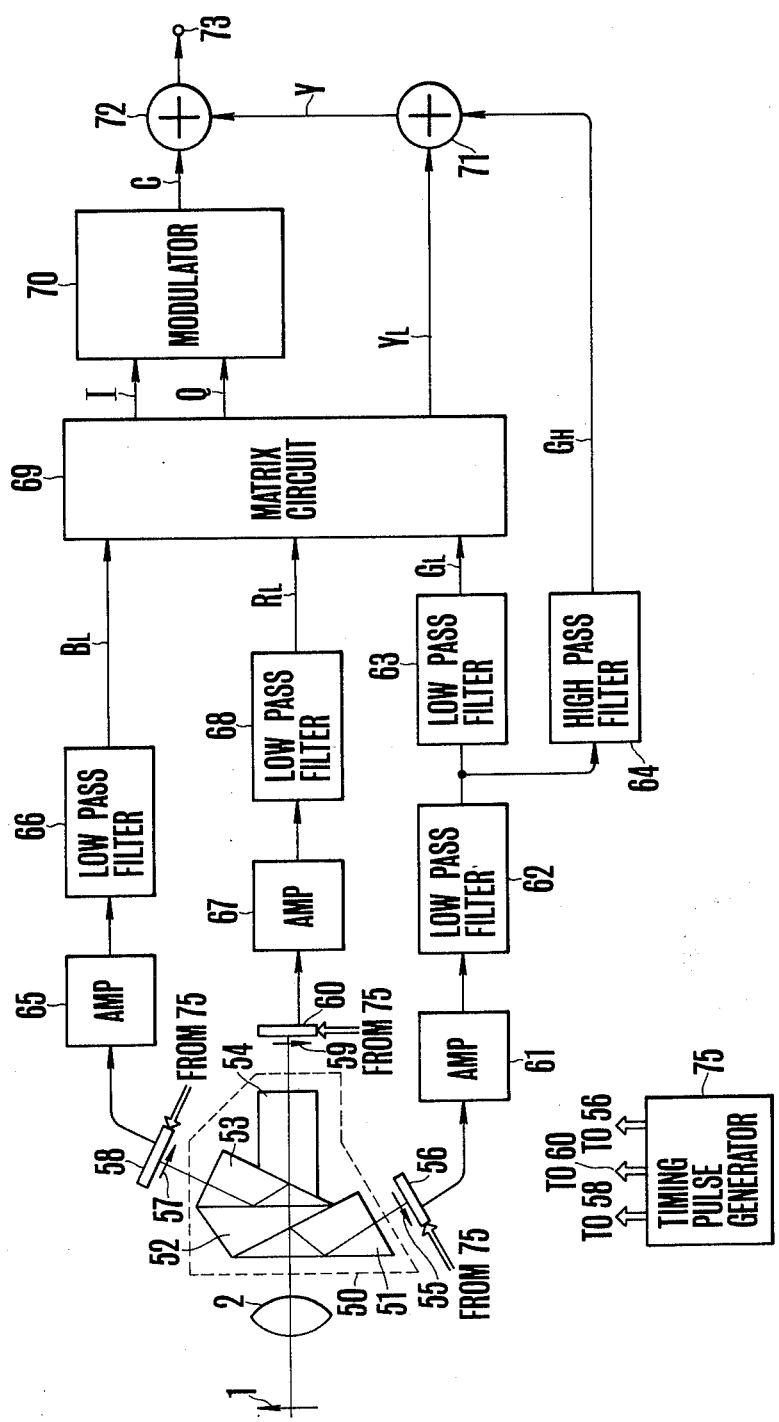
FIG. 5 is a block diagram showing a color image pick-up apparatus incorporated with another embodiment of the beam splitting prism optical system.

In the following, with reference to FIG. 5, still another embodiment of this invention as applied to most widely used color image pick-up apparatus of three primary color (R, G, B) type will be described.

More particularly, light from an object 1 is formed as independent green color image 55, blue color image 57 and red color image 59 via a lens 2 and a three color analytical optical system 50. The light images 55, 57 and 59 are converted into green, blue and red color signals respectively by photoelectric converting units of solid state image pick-up devices 56, 58 and 60 and these color signals are sent to amplifiers 61, 65 and 67 respectively.

Generally, a solid state image pick-up apparatus comprising a charge transfer element utilizes a silicon substrate so that its blue color sensitivity is low, as already has been pointed out. Consequently, in a color image pick-up apparatus, it is necessary to dispose ND filters in front of the green color image 55 and the red color image 59 to obtain a light quantity balance in the blue color image 57. Consequently, the sensitivity of the color image pick-up apparatus is determined by the blue color sensitivity. As above described, according to this invention since it is possible to improve the sensitivity by driving the solid state image pick-up device with deriving signals as shown by the solid line curves shown in FIGS. 3c and 3d, the sensitivity is increased by applying drive pulses as shown by solid lines in FIGS. 3c and 3d to the solid state image pick-up devices 58 and 60 in charge of blue color image 57 and red color image 59 respectively. When the image pick-up devices are driven with pulses shown by solid lines in FIGS. 3c and 3d the bandwidth of the image signal is narrowed as above described. For this reason, to synthesise a color difference signal by encoding three primary color signals of red, green and blue colors, low pass components of the three primary color signals are used, whereas the high pass component of the green color signal is used as the high pass component of the brightness signal. By utilizing the fact that the spectrum characteristic of a green color signal is very close to the visual sensitivity spectrum characteristic and that the resolution of color of human eyes is poor, no serious problem occurs even when the high pass component of a brightness signal is replaced by the highpass component of the green color signal.

Turning back to FIG. 5, the output signal from the solid state image pick-up device 56 is amplified by amplifier 61 to have a predetermined level and then passed through a low pass filter 62 having a cut-off frequency equal to a Nyquist frequency and then through a low pass filter 63 (having a cut-off frequency of 1.5 MHz) which isolates only low band signals utilized to synthesize a color difference signal thus supplying a low band component $G_L$ of the green color signal to a matrix circuit 69. The output signal from the solid state image pick-up device 58 is amplified by amplifier 65 to have predetermined level and then passed through a low pass filter 66 having a cut-off frequency equal to Nyquist frequency thus supplying the low band component of the blue color signal to the matrix circuit 69. It is desirable to make substantially equal the cut-off frequencies of the low pass filters 66 and 63. Regarding the red color signal, the low band component thereof is supplied to the matrix circuit 69 from the solid state image pick-up device 60 through amplifier 67 and a low pass filter 68, the cut-off frequency thereof being selected to be substantially equal to that of the low pass filters 63 and 66. The matrix circuit 69 outputs the low band component $Y_L$ with color chrominance signals I and Q, and a subcarrier wave signal is modulated with the color chrominance signals I and Q in a modulator 70 to obtain a chrominance signal C which is sent to a mixer 72. The output of the low pass filter 62 having a cut-off frequency equal to a Nyquist frequency of the green color signal channel is sent to a high pass filter 64 which is set to have the same cut-off frequency as the highest frequency passed by the low pass filter 63 so as to cut off a predetermined low band component. Thus, the high band component $G_H$ of the green color signal is sent to a mixer 71 where it is synthesized with the low band component $Y_L$ of the brightness luminance signal sent from the matrix circuit 69 to produce a high band brightness signal Y. The mixer 72 mixes the chrominance signal C with the brightness signal Y to produce a color television signal at an output terminal 73. Again, a timing signal generator 75 is provided to supply timing pulses to the solid state image pick-up devices 56, 58 and 60.

The three color beam splitting prism or optical system 50 comprises four prisms 51, 52, 53 and 54 which are constructed such that the green color light of the incident light is reflected at an interface between prisms 51 and 52 while other color light is transmitted through the prisms and that blue light color is reflected at an interface between prisms 53 and 54 while red color light is transmitted through the prism.

Figure 6:
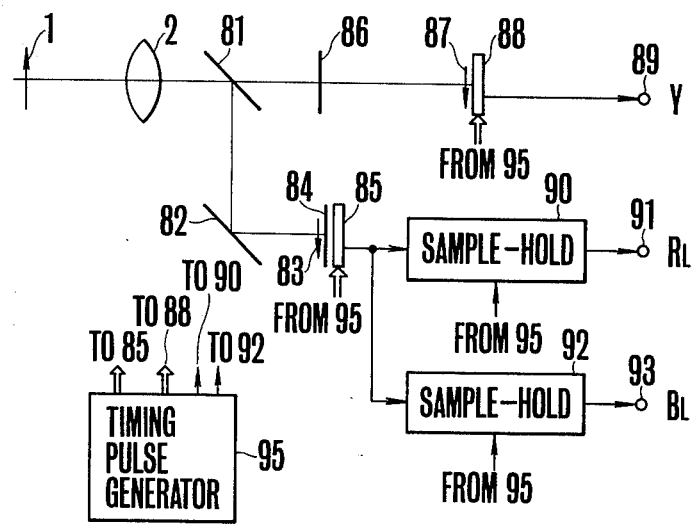
FIG. 6 is a diagrammatic representation of still another embodiment of the optical system according to this invention.
Figure 7:
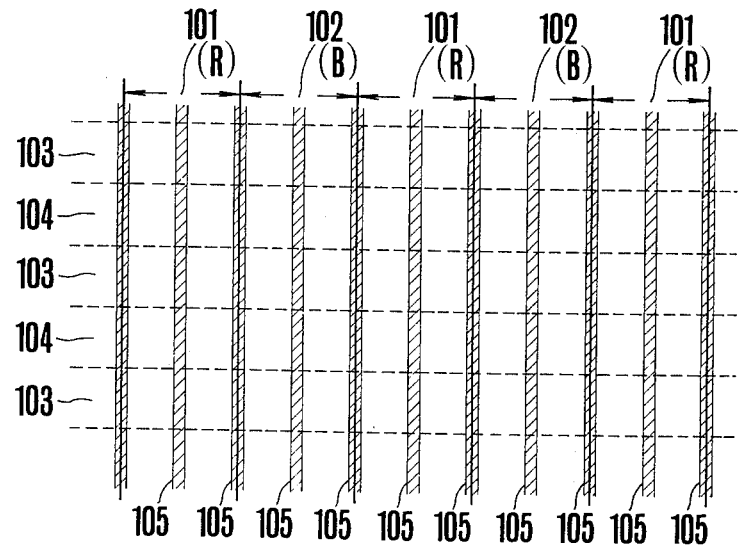
FIG. 7 is a graph showing a relative arrangement between a stripe filter utilized in the embodiment shown in FIG. 6 and the solid state image pick-up device.
Figure 8:
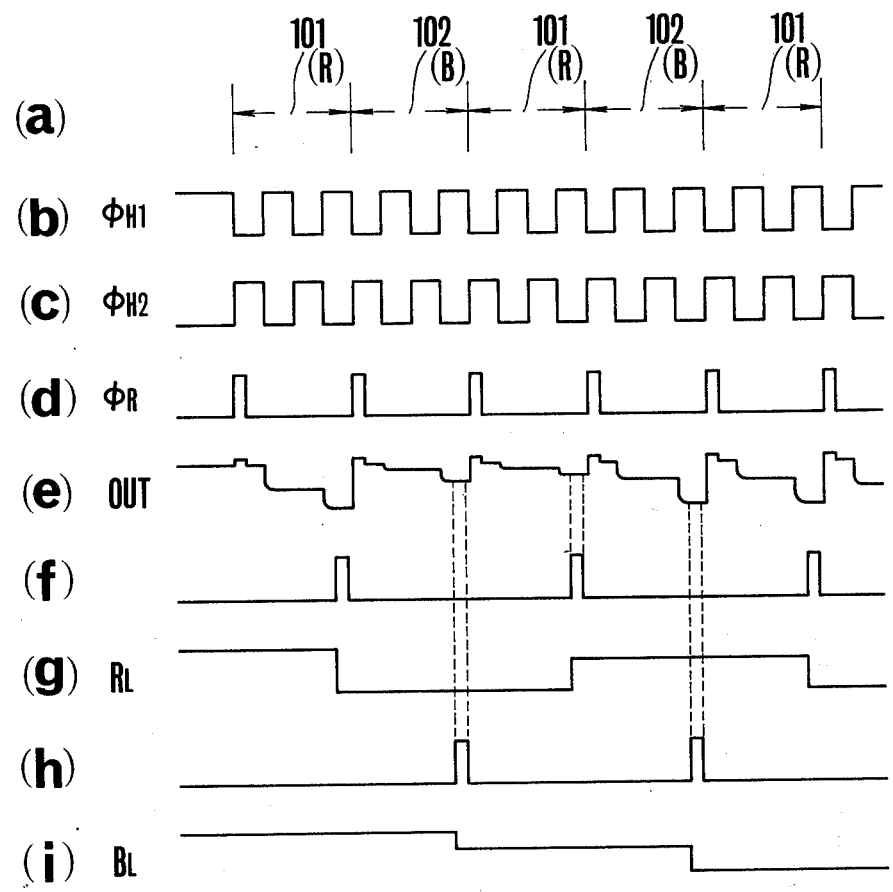
FIG. 8a through 8i show signal waveforms at various portions of the embodiment shown in FIG. 6.

FIG. 6 shows a modified optical system of this invention and circuit elements associated therewith. Thus, FIG. 6 shows a connection diagram of one example of a so-called two plate type color image pick-up apparatus which utilizes the fact that the quality of the color picture signal is not impaired, even if the bandwidth of the color signal channel is narrowed. In this embodiment, incident light from an object 1 passes through a lens, and then divided by a half mirror 81. The light transmitted through the half mirror 81 passes through a Y filter 86 having a visible sensitivity spectrum characteristic and that forms a light image 87 on the photoelectric converting unit of a solid state image pick-up device 88. The output of the solid state image pick-up device produced under the control of a timing pulse supplied from a timing pulse generator 95 is sent out from an output terminal 89 as a brightness signal. The light reflected by the half mirror 81 is reflected again by a total reflecting mirror 82, passes through a strip filter 84 which is located closely adjacent the photoelectric converting unit of a solid state image pick-up device 85 so as to form a light image 83. One example of the arrangement of the strip filter 84 and its positional relationship to the solid state image pick-up device 85 are illustrated in FIG. 7. In FIG. 7, optical filters 101 and 102 having different spectrum characteristics are arranged alternately to form stripes each having a width equal to the length of two bits in the lateral direction of the solid state image pick-up device 85 so that the interface between adjacent stripes coincides with that between the picture elements of the solid state image pick-up device. A drive pulse as shown in FIG. 3c is applied to the solid state image pick-up device 85 from the timing pulse generator 95 so that the spacial arrangement of the stripe filter will have a phase relationship with respect to the drive pulse as shown in FIGS. 8a, through 8d. More particularly, FIG. 8a shows an arrangement of the stripe filter 84. For example, red light passes through a stripe element 101 while blue light passes through a stripe element 102. The signal charges of the picture elements at these spacial positions are determined by the drive pulses $\phi_{H1}$ and $\phi_{H2}$ (see FIGS. 8b and 8c) applied to registers in the row or horizontal direction. When a drive pulse $\phi_R$ applied to electrode 26 shown in FIG. 2 takes the form shown in FIG. 8a, a signal having a waveform as shown in FIG. 8e can be obtained having a level formed by synthesizing signal charges of two picture elements underlying respective stripe elements of the stripe filter which are arranged in space as shown in FIG. 8a. The waveform of the signal shown in FIG. 8e repeats alternately in the order of a red signal and then a blue signal, and at a period of the drive pulse $\phi_R$ applied to the electrode 26 shown in FIG. 2. The signal shown in FIG. 8e is the output signal of the solid state image pick-up device 85 shown in FIG. 6 and applied to sample hold circuits 90 and 92. The sample hold circuit 90 samples and holds under the control of a sampling pulse (FIG. 8f) which is generated by the timing pulse generator 95 and the output signal from the sample hold circuit 90 has a waveform as shown in FIG. 8g. The sample hold circuit 92 samples and holds under the control of a sampling pulse shown in FIG. 8h and generated by the timing pulse generator 95, and the output signal from the sample hold circuit 92 has a waveform as shown in FIG. 8i. Thus, an independent red color signal and a blue color signal are produced on output terminals 91 and 93 respectively. As above described, although the resolution decreases the sensitivity is improved so that it is possible to change the ratio of division of the incident light by the half mirror 81 thereby improving the sensitivity of the image pick-up device.

In FIG. 7, 103 and 104 show two types of electrodes of the registers in the column or vertical direction, while 105 designates a channel stopper that isolates picture elements in the row or horizontal direction. The width of the stripe filters 101 and 102 is not limited to the length of two picture elements and may be equal to the length of 3 or more picture elements in which case the sensitivity increases by a factor of an integer equal to the number of the picture elements to be synthesized. It is to be noted that the type of the stripe filter is not limited to two and that 3 types corresponding to red, green and blue colors can also be used.

While the color filter is an elongated stripe filter, in the case of a dot filter, so long as the width in the row or horizontal direction corresponds to the length of a plurality of picture elements of a solid state image pick-up device, adjacent picture elements in the column or vertical direction are not required to have the same spectrum characteristic. Thus, it is possible to improve the sensitivity when the solid state image pick-up device is driven so as to synthesize a plurality of picture elements corresponding to the width in the row or horizontal direction of the color filter element.

In the above described embodiments, signal charges corresponding to a plurality of adjoining and continuous photoelectric converting elements of the solid state image pick-up devices each constituted by charge transfer elements were synthesized in charge detecting elements. Thus, the solid state image pick-up device is constituted by charge transfer elements utilized in color signal channels in which the number of the picture elements was decreased so as to decrease the resolution to a degree necessary to form a color signal component but the sensitivity has been increased by a degree correspoinding to the decrease in the resolution.

An example in which signal charges corresponding to a plurality of adjacent photoelectric converting elements of the solid state image pick-up devices each constituted by charge transfer elements are synthesized in the charge transfer registers in the row or horizontal direction will be described hereunder.

Figure 10:
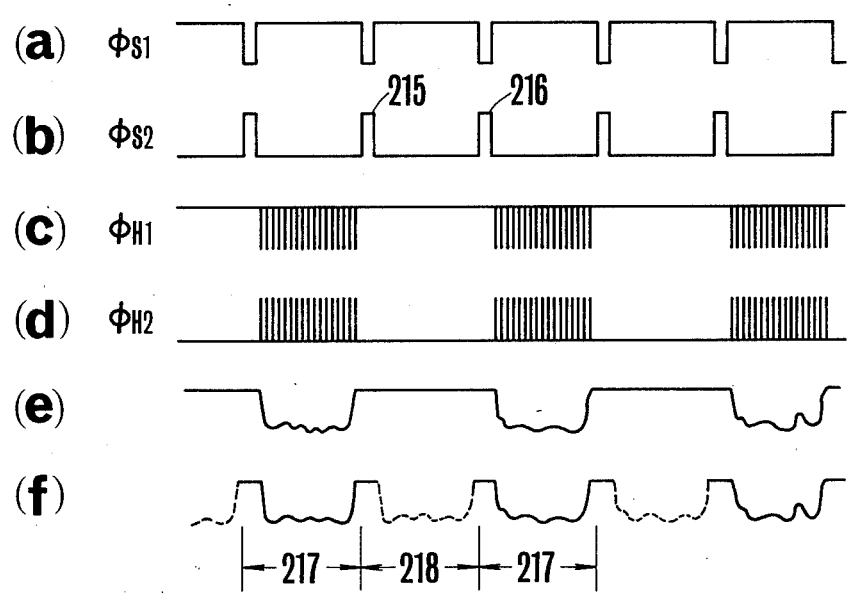
FIG. 10a through 10f show signal waveforms at various portions of the embodiment shown in FIG. 9.

For the sake of description, it is assumed now that a solid state image pick-up device 200 shown in FIG. 9 is of a so-called frame transfer type. In FIG. 9, a charge accumulation electrode and a charge transfer electrode of an image pick-up area 201 are desginated by reference characters 205 and 206 respectively and charge transfer electrodes at a charge storase area 202 are designated by 207 and 208. Timing pulses $\phi_{I1}$, $\phi_{I2}$, $\phi_{S1}$ and $\phi_{S2}$ are applied to these electrodes from a timing pulse generator 220. In the frame transfer type solid state image pick-up device 200, the signal charge corresponding to an incident light image and accumulated in the image pick-up area 201 is transferred to the charge storage area 202 in a direction indicated by an arrow 209 and through entire interface. Upon completion of the charge transfer, in only the charge storage area 202 the charge of each row is transferred to charge transfer registers 203 arrange in the row or horizontal direction, in a direction indicated by arrow 210. Then drive pulses $\phi_{H1}$ and $\phi_{H2}$ are applied to electrodes 22 and 23 respectively to cause a charge detecting element 204 to produce an output signal. In this case, when the charge transfer registers 203 in the row or horizontal direction are driven as shown in FIGS. 10c and 10d it is possible to synthesize, in these charge transfer registers 203, signal charges corresponding to images focused on continuous photoelectric converting elements adjoining in the column or vertical direction. FIGS. 10a through 10f show the waveforms of the drive pulses applied to respective electrodes and an output signal which is produced each time charge is transferred in the row or horizontal direction. At each time charge transfers in the column or vertical direction of the charge storage area, charges corresponding to one line in the charge storage area 202 are simultaneously transferred to charge transfer registers 203 by a transfer pulse 215 ($\phi_{S2}$) shown in FIG. 10b and generated by the timing pulse generator 220. However, during an interval 218, drive pulses $\phi_{H1}$ and $\phi_{H2}$ shown in FIGS. 10c and 10d are not applied to electrodes 22 and 23 from the timing pulse generator 220, so that the charge transfer registors 203 do not transfer signal charges in the row or horizontal direction but hold these charges. Then, by a transfer pulse 216 shown in FIG. 10b and generated by the timing pulse generator 220, the charges of the next row or horizontal line in the charge storage area 202 are simultaneously transferred to the charge transfer registers 203 and mixed therein with signal charges corresponding to previous row or horizontal line with reference to each picture element.

Consequently, the signal charge of each picture element in the registers 203 becomes equal to the sum of previously accumulated charge and newly accumulated charge, thus increasing twice.

During an interval 217 shown in FIG. 10f, as drive pulses $\phi_{H1}$ and $\phi_{H2}$ shown in FIGS. 10c and 10d are applied to electrodes 22 and 23 respectively from the timing pulse generator 220, the charges are converted into an image signal by the charge detecting element 204. The output image signal is passed through a low pass filter (not shown) having a cut-off frequency equal to Nyquist frequency so that an image signal can be obtained which is eliminated at each horizontal period as shown in FIG. 10e.

This image signal is passed through a delay circuit 212 which delays it by one horizontal period (1H) and through a transfer switch 213 which alternately produces, at a period of 1H, the image signal not passing through the delay circuit 212 during an interval 217 and the image signal passing through the delay circuit 212 during an interval 218, thereby forming a continuous signal. It is also possible to improve the sensitivity by a method of synthesizing signal charges in the charge transfer registers 203 arranged in the row or horizontal direction. According to this method, however, although the resolution in the row or horizontal direction does not decrease in any appreciable extent, the resolution in the column or vertical direction decreases to one half so that this system is suitable to be used in color signal channels or a color image pick-up device. In other words, it is possible to apply the method of driving shown in FIGS. 10a through 10f to the solid state image pick-up devices 13, 18 and 21 shown in FIG. 1, to the solid state image pick-up devices 39 and 43 shown in FIG. 4, to the solid state image pick-up devices 58 and 60 shown in FIG. 5 and to the solid state image pick-up device 85 shown in FIG. 6. Although, according to the method of driving just described, only two adjacent picture elements in the column or vertical direction were synthesized, three picture elements can be synthesized in the same manner.

The method of synthesizing the signal charges in charge transfer registers which are arranged in the row or horizontal direction can also be used in a case where an elongated color stripe filter is used. Where a dot filter is used, the method can be used provided that the width of the filter element in the column or vertical direction corresponds to the length of a plurality of picture elements in the column or vertical direction of a solid state image pick-up device.

Although in the foregoing description, solid state image pick-up devices of the area sensor type have been described, the driving method shown in FIG. 3 is not limited to the solid state image pick-up device of the area sensor type but it can also be applied to a solid state image pick-up device of the line sensor type.

In both methods of driving shown in FIGS. 3a–3e and 10a–10f, signal charges corresponding to two adjoining photoelectric converting elements were synthesized, but it will be clear that signal charges corresponding to three or more photoelectric converting elements can also be synthesized.

Generally, the method of driving shown in FIGS. 3a–3e is efficient where it is applied to a solid state image pick-up device containing a relatively large number of picture elements in the row or horizontal direction, whereas the method of driving shown in FIGS. 10a–10f is efficient where it is applied to a solid state image pick-up device containing a relatively large number of picture elements in the column or vertical direction.

It can readily be understood from the foregoing description that where each one of the two driving methods is applied to a solid state image pick-up device of the area sensor type, the sensitivity can be improved.

In addition to a frame transfer type solid state image pick-up device, the invention is also applicable to an interline type solid state image pick-up device. Furthermore, the solid state image pick-up device is not limited to one comprising charge transfer elements but may be a solid state image pick-up device of the MOS transistor type. It will also be clear that, in addition to a color television camera, the invention can also be applied to facimile devices, color copying machines, color signal analysers, etc. which obtain color electric signals from colored objects.

Having described several embodiments of a color solid image pick-up apparatus and methods of operation thereof according to the invention, it is believed apparent that many changes, modifications and additions will be obvious to those skilled in the art in the light of the above teachings. It is therefore to be understood that all such changes, modifications and additions are intended to be covered which come within the true spirit and scope of this invention as defined by the appended claims.

What is claimed is:

1. A color solid state image pick-up apparatus comprising:
   an optical system which separates incident light from an object to be photographed into a brightness light component and a plurality of color light components;
   a first solid state image pick-up device having photoelectric converting units disposed at the position of a light image of said brightness light component;
   a group of second solid state image pick-up devices having their photoelectric converting units disposed at positions respectively corresponding to positions of light images of each of said plurality of color light components;
   each of said second solid state image pick-up devices having solid state photoelectric converting means, charge transfer electrodes and a charge detection element;
   first drive circuit means which drives said first solid state image pick-up device for sequentially detecting signal charges corresponding to the light brightness component of respective photoelectric converting units of said first solid state image pick-up device; and
   second drive circuit means which drives each of said group of the second solid state image pick-up devices in a manner to combine signal charges which are sequentially transferred through portions of the solid state photoelectric converting means beneath at least two charge transfer electrodes of at least one second solid state image pick-up device to synthesize an enhanced charge signal detected by the charge detection element to thereby improve sensitivity of the image pick-up apparatus to said color light components.

2. A color solid state image pick-up apparatus comprising:
   an optical system which separates incident light from an object to be photographed into a green color component, a blue color component and a red color component;
   a first solid state image pick-up device having a photoelectric converting unit which is disposed at a position of a light image of said green color component and including a plurality of photoelectric converting elements;
   a second and a third solid state image pick-up devices respectively having photoelectric converting units which are disposed at positions of light images of said blue and red color components and respectively including a plurality of charge transfer electrodes and a charge detection element;
   first drive circuit means for driving said first solid state image pick-up device so as to sequentially detect signal charges of respective photoelectric converting elements of said first solid state image pick-up device;
   second drive circuit means which synthesizes in said charge detection elements combined signal charges of a plurality of continuous photoelectric converting elements, said signal charges being sequentially transferred through portions of said photoelectric converting units beneath said charge transfer electrodes of at least one of said second and third solid state image pick-up devices and combined in said charge detection elements;
   a filter circuit for separating an output signal from said first solid state image pick-up device into a low pass component and a high pass component;
   matrix circuit means for synthesizing two types of color signals and a brightness signal of said low pass component in response to said low component of an output signal of said filter circuit and output signals of said second and third solid state image pick-up devices; and
   synthesizing circuit means which adds together a brightness signal of the low pass component of an output signal of said matrix circuit and a high pass component of an output of said first solid state image pick-up device thereby synthesizing a brightness signal having a wide pass band.

3. A color solid state image pick-up apparatus comprising:
   an optical system which separates incident light from an object to be photographed into a green color component, a blue color component and a red color component;
   a first solid state image pick-up device having a photoelectric converting unit which is disposed at a position of a light image of said green color component and including a plurality of photoelectric converting elements;
   a second and a third solid state image pick-up devices respectively having photoelectric converting units which are disposed at positions of light images of said blue and red color components and respectively including a plurality of charge transfer electrodes and a charge detection element;
   first drive circuit means for driving said first solid state image pick-up device so as to sequentially detect signal charges of respective photoelectric converting elements of said first solid state image pick-up device;
   second drive circuit means which synthesizes in said charge detection elements combined signal charges of a plurality of continuous photoelectric converting elements, said signal charges being sequentially transferred through portions of said photoelectric converting units beneath said charge transfer electrodes of at least one of said second and third solid state image pick-up devices and combined in said charge detection elements;

a filter circuit for separating an output signal from said first solid state image pick-up device into a low pass component and a high pass component;

matrix circuit means for synthesizing two types of color signals and a brightness signal of said low pass component in response to said low component of an output signal of said filter circuit and output signals of said second and third solid state image pick-up devices;

synthesizing circuit means which adds together a brightness signal of the low pass component of an output signal of said matrix circuit and a high pass component of an output of said first solid state image pick-up device thereby synthesizing a brightness signal having a wide pass band;

third drive circuit means which drives at least one of said second and third solid state image pick-up devices so as to synthesize, at portions of said photoelectric converting units beneath the charge transfer electrodes arranged in a row direction of said photoelectric converting elements signal charges of a plurality of continuous photoelectric converting elements which are disposed in a column direction of said photoelectric converting elements and belonging to at least one of said second and third solid state image pick-up devices;

delay circuit means connected with a solid state image pick-up device driven by said third drive circuit means for delaying an output signal of at least one of said second and third image pick-up devices driven by said third circuit means for a time period corresponding to one period in which signal charges are transferred in the row direction of said photoelectric converting elements; and second synthesizing circuit means including means for synthesizing a continuous signal by alternating switching an output signal of said delay circuit means and an output signal of a solid state image pick-up device corresponding to the signal of said delay circuit means.

4. A color solid state image pick-up apparatus comprising:

an optical system which divides incident light from an object to be photographed into first and second light components;

a first solid state image pick-up device with a photoelectric converting unit disposed at a position of a light image of said first light component and including a plurality of photoelectric converting elements;

a color filter arranged at a position of a light image of said second light component comprising a repetition of a plurality of color filter elements having different spectrum characteristics;

a second solid state image pick-up device comprising a charge detection element and a plurality of charge transfer elements which are arranged such that several photoelectric converting elements of said second solid state image pick-up device correspond to one of the color filter elements of said color filter;

a first drive circuit which drives said first solid state image pick-up device so as to sequentially detect signal charges corresponding to respective photoelectric converting elements of said first solid state image pick-up device; and a second drive circuit which drives said second solid state image pick-up device so as to synthesize in said charge detection element signal charges of said photoelectric converting elements corresponding to said color filter elements of said color filter, said signal charges being sequentially transferred through portions beneath said charge transfer elements of said second solid state image pick-up device into said charge detection element.

5. The color solid state image pick-up apparatus according to claim 1, 2, 3 or 4 wherein said optical system utilizes a half mirror.

6. The color solid state image pick-up apparatus according to claim 4 wherein said optical system analyzes said incident light into a green light component and components of another colors, and which further comprises a filter circuit which separates an output signal from said first solid state image pick-up device into a low band component and a high band component, a matrix circuit for synthesizing two types of color difference signals and a brightness signal of said low band component from a low band component of an output of said filter circuit and a plurality of color signals separated from an output signal of said second solid state image pick-up device, and a synthesizing circuit including means which adds together a brightness signal comprising a low band component of an output signal of said matrix circuit thereby synthesizing a brightness signal in a high band.

7. In a color solid state image pick-up apparatus of separated luminance type wherein incident light from an object is decomposed into a brightness component and color components and wherein one or more solid state image pick-up devices are utilized each comprising a plurality of charge transfer elements arranged in rows and columns and disposed at positions corresponding to light images of said color components, the improvement which comprises;

a drive circuit which drives one or more of said plurality of solid state image pick-up devices corresponding to color signals so as to synthesize at a portion beneath charge transfer elements adapted to transfer signal charges in a row direction of a plurality of continuous photoelectric converting elements of said one or more solid state image pick-up devices which are arranged in the direction of said column of said charge transfer elements;

delay circuits connected to one or more of said plurality of solid state image pick-up devices corresponding to said color signals for delaying output signals of one or more solid state image pick-up devices corresponding to said color signals by a time corresponding to one period in which signal charges of respective solid state image pick-up devices are transferred in the direction of a row of said charge transfer elements; and a synthesizing circuit including means for switching an output of said delay circuit and an output signal of a solid state image pick-up device corresponding to said delay circuit thereby producing a continuous signal.

8. The color solid state image pick-up apparatus according to claim 7 wherein said charge transfer elements comprise a plurality of registers and said color solid state image pick-up device further comprises a charge detection element and a second drive circuit which drives one or more of said solid state image pick-up devices so as to synthesize in said charge detection element signal charges of said registers arranged in a row direction of said charge transfer elements, said signal charges being sequentially transferred through a portion beneath charge transfer elements in the direction of row said charge transfer elements into said charge detection element.

* * * * *